United States Patent
Landolt

(10) Patent No.: US 7,280,092 B2
(45) Date of Patent: Oct. 9, 2007

(54) DRIVER CIRCUIT AND METHOD FOR DRIVING AN ELECTRICAL DEVICE WITH A CONTROLLED SLEW RATE

(75) Inventor: Oliver Dieter Landolt, Mountain View, CA (US)

(73) Assignee: Avago Technologies General IP Pte Ltd, Singapore (SG)

( * ) Notice: Subject to any disclaimer, the term of this patent is extended or adjusted under 35 U.S.C. 154(b) by 418 days.

(21) Appl. No.: 10/646,032

(22) Filed: Aug. 22, 2003

(65) Prior Publication Data

US 2005/0052380 A1    Mar. 10, 2005

(51) Int. Cl.
 G09G 3/36    (2006.01)
(52) U.S. Cl. .......................... 345/98; 345/87
(58) Field of Classification Search .......... 345/55–100, 345/204–214, 690; 327/130
 See application file for complete search history.

(56) References Cited

U.S. PATENT DOCUMENTS

| | | | |
|---|---|---|---|
| 5,949,259 A | 9/1999 | Garcia | |
| 2002/0000969 A1* | 1/2002 | Ozawa | 345/100 |
| 2002/0180685 A1* | 12/2002 | Itakura et al. | 345/100 |
| 2003/0146923 A1* | 8/2003 | Nakahira et al. | 345/690 |
| 2004/0036670 A1* | 2/2004 | Chung | 345/99 |

OTHER PUBLICATIONS

"A 12-Transistor PFM Demodulator for Analog Neural Networks Communication" by Alessandro Mortara and Eric A. Vittoz, IEEE Transactions on Neural Networks, vol. 6, No. 5, Sep. 1995, pp. 1280-1283.*
Alessandro Mortara and Eric A. Vittoz, "A 12-Transistor PFM Demodulator for Analog Neural Networks Communications", IEEE Trans. on Neural Networks, vol. 6, No. 5, Sep. 1995, pp. 1280-1283.
F. Garcia, P. Coll and D. Auvergne, "Design of a Slew Rate Controlled Output Buffer", Proc. 11th Annual IEEE ASIC Conf., 1998, pp. 147-150.

* cited by examiner

Primary Examiner—David L. Lewis

(57) ABSTRACT

A driver circuit and method for driving an electrical device, such as an LC device, utilizes a feedback capacitor and a reference current on an output transistor to control the slew rate of the generated output signal. In an embodiment, a stored signal from a previous operating cycle is used to activate the output transistor, which ensures that the initial slew rate for each rising or falling edge transition of the output signal is at an appropriate level. The controlled slew rate of the output signal does not depend on the load or other external factors. Thus, the driver circuit provides an output signal that can be used to drive the electrical device with high accuracy and long-term stability.

19 Claims, 4 Drawing Sheets

DRIVER CIRCUIT AND METHOD FOR DRIVING AN ELECTRICAL DEVICE WITH A CONTROLLED SLEW RATE

FIELD OF THE INVENTION

The invention relates generally to circuits, and more particularly to a driver circuit and method for driving an electrical device, such as a liquid-crystal device.

BACKGROUND OF THE INVENTION

Liquid-crystal (LC) cells can change the polarization of light traveling across the cells under control of an electrical signal. Thus, in conjunction with polarization-selective optical components, LC cells can be used to build optical devices, such as displays, optical switches, optical multiplexers and electrically controllable optical attenuators.

The polarization changing property of LC cells is dependent on the root-mean-square (RMS) amplitude of an applied AC electric field. Typically, the magnitude of polarization change is a continuous function of the RMS amplitude of the driving voltage. For many applications, notably in optical communications applications, very precise control over electrical driving conditions of the LC cells and long-term stability are required. To meet these requirements, it is necessary to generate driving signals with constant RMS voltage. One efficient method to adjust the RMS voltage consists of varying the duty cycle of a binary driving signal.

However, rapid transitions in the driving signal may lead to problems. If the driving circuit generates very sharp transitions, the actual electric field experienced by the LC cells will be low-pass filtered as a result of electrode resistance and the inherent capacitance of the cells. Electrode resistance is typically substantial because most LC applications require at least one of the electrodes to be transparent, which prohibits the use of material having a high electrical conductivity for the electrodes. In addition, the inherent capacitance of an LC cell depends on the orientation of the LC molecules within the material, and is therefore, bound to change over time. As a result, the effective RMS voltage experienced by the LC cells is significantly dependent on factors outside the control of the driver circuit, such as the parasitic resistance and capacitance of the LC cells. In addition to this problem, some LC materials exhibit substantial dependency on the frequency of the driving signal, whereby higher harmonics may effectively counteract the action of the fundamental driving component.

In view of these concerns, there is a need for a driver circuit and method for driving an electrical device, such as a LC device, with high accuracy and long-term stability.

SUMMARY OF THE INVENTION

A driver circuit and method for driving an electrical device, such as an LC device, utilizes a feedback capacitor and a reference current on an output transistor to control the slew rate of the generated output signal. In an embodiment, a stored signal from a previous operating cycle is used to activate the output transistor, which ensures that the initial slew rate for each rising or falling edge transition of the output signal is at an appropriate level. The controlled slew rate of the output signal does not depend on the load or other external factors. Thus, the driver circuit provides an output signal that can be used to drive the electrical device with high accuracy and long-term stability.

A driver circuit in accordance with an embodiment of the invention includes an output transistor, a current source and a feedback capacitor. The output transistor is connected between a voltage terminal and an output node to produce an output signal on the output node. The current source is connected to a control terminal of the output transistor to provide a reference current. The feedback capacitor is connected from the output node to the control terminal of the output transistor to control the output transistor as a function of the difference between current through the capacitor and the reference current.

The driver circuit may further include a memory connected to the control terminal of the output transistor. The memory stores a signal on the control terminal from a previous operating cycle in which the output transistor was activated.

A method for driving an electrical device includes receiving an input signal, applying a stored signal to an output transistor in response to the input signal to produce an output signal on an output node, and controlling the output signal on the output node using the difference between a reference current and the current fed back capacitively from the output node to the output transistor.

Other aspects and advantages of the present invention will become apparent from the following detailed description, taken in conjunction with the accompanying drawings, illustrated by way of example of the principles of the invention.

DETAILED DESCRIPTION

Figure 1:
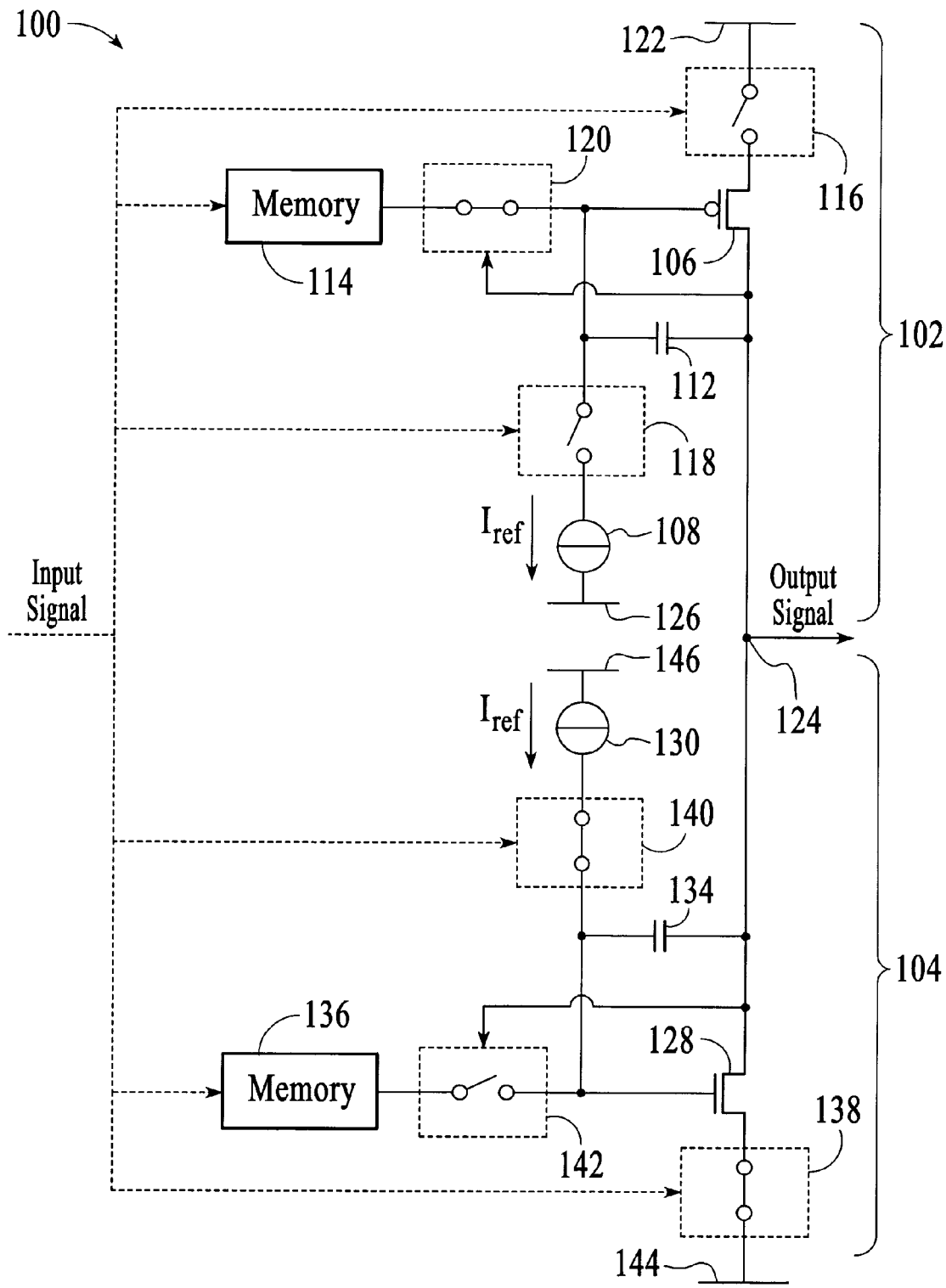
FIG. 1 is a diagram of a driver circuit for driving an electrical device, such as a liquid crystal (LC) device, in accordance with an embodiment of the present invention.

With reference to FIG. 1, a driver circuit 100 in accordance with an embodiment of the invention is shown. The driver circuit 100 is designed to drive an electrical device (not shown), such as a liquid crystal (LC) device, using a driving output signal with controlled slew rate. The output signal of the driver circuit 100 is independent of external load or other external factors. In addition, the initial slopes during transitions of the output signal between different signal levels are sharp because the driver circuit 100 is designed to automatically adapt to the loading conditions at the beginning of each transition. Thus, the driver circuit 100 is able to drive the electrical device with high accuracy and long-term stability.

Figure 2:
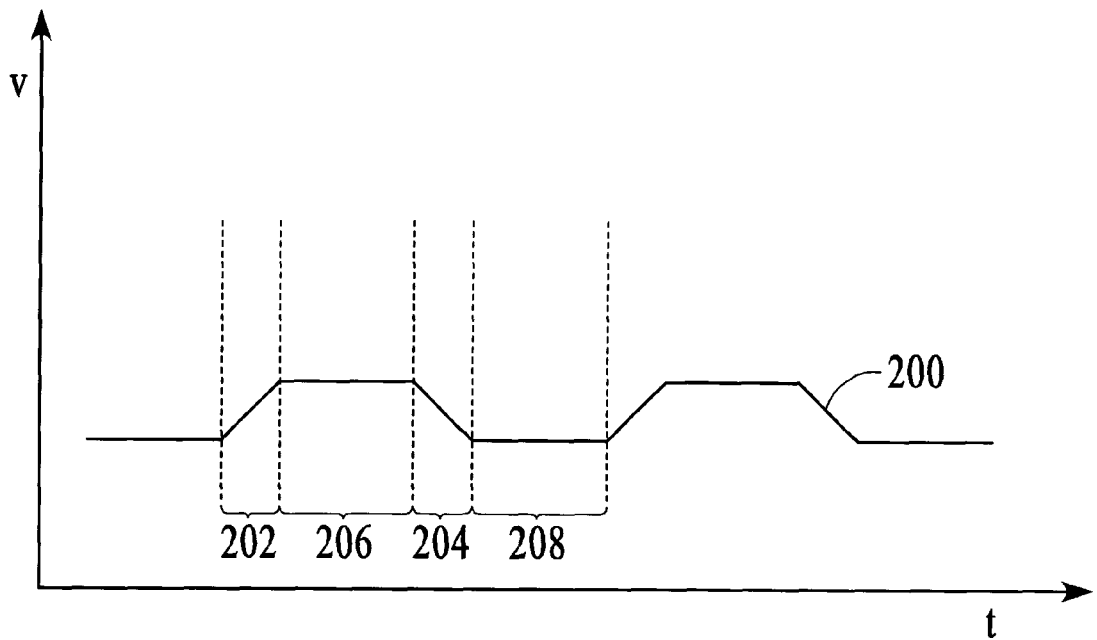
FIG. 2 is an illustration of an output signal generated by the driver circuit of FIG. 1.

As shown in FIG. 1, the driver circuit 100 includes a pull-up circuit 102 and a pull-down circuit 104. Both the pull-up and pull-down circuits 102 and 104 are similar in structure and operation. The pull-down circuit 104 is configured in a mirror image of the pull-up circuit 102. However, complementary device types are used for the two circuits. The driver circuit 100 operates to generate a trapezoidal driving output signal 200, as illustrated in FIG. 2. The trapezoidal output signal 200 can be divided into four phases, a rising edge transition 202, a falling edge transition 204, a high-level section 206 and a low-level section 208. The rising edge transition 202 and the high-level section 206 of the output signal 200 are produced by the pull-up circuit 102 of the driver circuit 100. The falling edge transition 204 and the low-level section 208 of the output signal 200 are produced by the pull-down circuit 104 of the driver circuit 100. In FIG. 1, the driver circuit 100 is shown in a configuration to produce the low-level section of the output signal 200. As described in detail below, the transitions 202 and 204 of the output signal 200 generated by the driver circuit 100 are very precise. Therefore, the trapezoidal output signal 200 can be used to provide an accurate root-mean-square (RMS) voltage to the electrical device being driven by the driver circuit 100.

The pull-up circuit 102 includes an output pull-up transistor 106, a reference current source 108, a feedback capacitor 112, an analog memory 114 and switches 116, 118 and 120. The switch 116 and the pull-up transistor 106 are connected in series between a high voltage terminal 122 and an output node 124. The high voltage terminal 122 may be a supply voltage rail. The source of the pull-up transistor 106 is connected to the high voltage terminal 122 via the switch 116. The drain of the pull-up transistor 106 is connected to the output node 124, which is connected to the electrical device to be driven by the driver circuit 100. The gate, i.e., the control terminal, of the pull-up transistor 106 is connected to the memory 114 via the switch 120. The pull-up transistor 106 is shown as a P-channel field-effect transistor (PFET). However, another type of transistor may instead be used, such as a bipolar transistor.

The feedback capacitor 112 is connected between the output node 124 and the gate of the pull-up transistor 106. The gate of the pull-up transistor 106 is also connected to the reference current source 108 via the switch 118. Thus, the reference current source 108 is connected to the gate of the pull-up transistor 106 when the switch 118 is closed. The reference current source 108 is further connected to a low voltage terminal 126, which may be electrical ground.

The control inputs of switches 116 and 118 are connected to receive a digital input signal, which controls these switches. When the switches 116 and 118 are closed in response to one state of the input signal, the pull-up circuit 102 is activated to pull the voltage on the output node 124 high. When the switches 116 and 118 are opened in response to the other state of the input signal, the pull-up circuit 102 is deactivated and the voltage on the output node 125 is pulled low by the pull-down circuit 104.

The control input of switch 120 is connected to the output node 124. Thus, the switch 120 is controlled by the voltage on the output node 124. The switch 120 is closed during a rising edge transition of the output signal to provide a sample of the voltage on the gate of the pull-up transistor 106 to the memory 114. The stored voltage is then applied to the gate of the pull-up transistor 106 at the start of a subsequent rising edge transition of the output signal to ensure a proper slope of the rising edge transition. The memory 114 is an analog memory that stores the voltage sample from the gate of the pull-up transistor 106. The structure and operation of the memory 114 are described in detail below.

The operation of the pull-up circuit 102 is now described. When the switches 116 and 118 are closed by the change in the state of the input signal at the start of the rising edge transition 202, the pull-up transistor 106 will conduct current, which tends to pull the voltage on the output node 124 high. The current conducted by the pull-up transistor 106 depends on the voltage on the gate of the transistor. As described below in more detail, the initial gate voltage on the pull-up transistor 106 is provided by the memory 114 since the switch 120 is also closed at the start of the rising edge transition 202. The voltage increase on the output node 124 causes current to flow through the capacitor 112. If the rate of change, i.e., "slew rate", of the voltage on the output node 124 for a rising-edge transition is so high that the current through the capacitor 112 exceeds the reference current $I_{ref}$ provided by the current source 108, then the gate voltage of the pull-up transistor 106 will increase. Consequently, the current flowing through the pull-up transistor 106 will decrease, which lowers the rising-edge slew rate of the voltage on the output node 124.

Conversely, if the rising-edge slew rate of the voltage on the output node 124 is too low, then the reference current $I_{ref}$ will cause the gate voltage of the pull-up transistor 106 to decrease. Consequently, the current flowing through the pull-up transistor 106 will increase, which increases the slew rate of the voltage on the output node 124. The pull-up circuit 102 will stabilize at a point where the slew rate is constant and satisfies the following equation:

$$\frac{dV_{out}}{dt} = \frac{I_{ref}}{C_{sense}}, \quad \text{(equation 1)}$$

where $V_{out}$ is the voltage of the output signal on the output node 124, $dV_{out}/dt$ is the slew rate and $C_{sense}$ is the capacitance of the capacitor 112.

The slew rate depends only on the value of the capacitance $C_{sense}$ and the value of the reference current $I_{ref}$. Thus, the slew rate does not depend on the external load or other external factors. Typically, the value of the capacitance $C_{sense}$ is very stable in integrated circuits. In addition, the value of the reference current $I_{ref}$ can be made very precise by using a current source that generates the reference current in such a way that the reference current is proportional to a reference voltage $V_{ref}$, a reference frequency f and a reference capacitance matched to the capacitance $C_{sense}$. Or expressed mathematically:

$$I_{ref} = f \cdot C_{sense} \cdot V_{ref} \quad \text{(equation 2)}$$

By substituting this expression into equation 1, the slew rate becomes:

$$\frac{dV_{out}}{dt} = f \cdot V_{ref}. \quad \text{(equation 3)}$$

Equation 3 shows that the slew rate depends only on parameters that can be well controlled. An accurate reference voltage can be derived from a bandgap voltage reference circuit. In addition, an accurate reference frequency can be obtained using a crystal oscillator. Thus, the slew rate does not depend on manufacturing process parameters. As an example, the current source 108 may include a frequency-to-current converter that produces the described reference current $I_{ref}$ by periodically charging a reference capacitor to a reference voltage at a reference frequency. The charged voltage from the capacitor is discharged to the gate of a transistor to generate the desired reference current. An example of such a frequency-to-current converter is described in "A 12-transistor PFM demodulator for analog neural networks communications" by A. Mortara and E. Vittoz, IEEE Trans. Neural Networks, Vol. 6, No. 5, September 1995, pp. 1280-1283, which is incorporated herein by reference.

Figure 3:
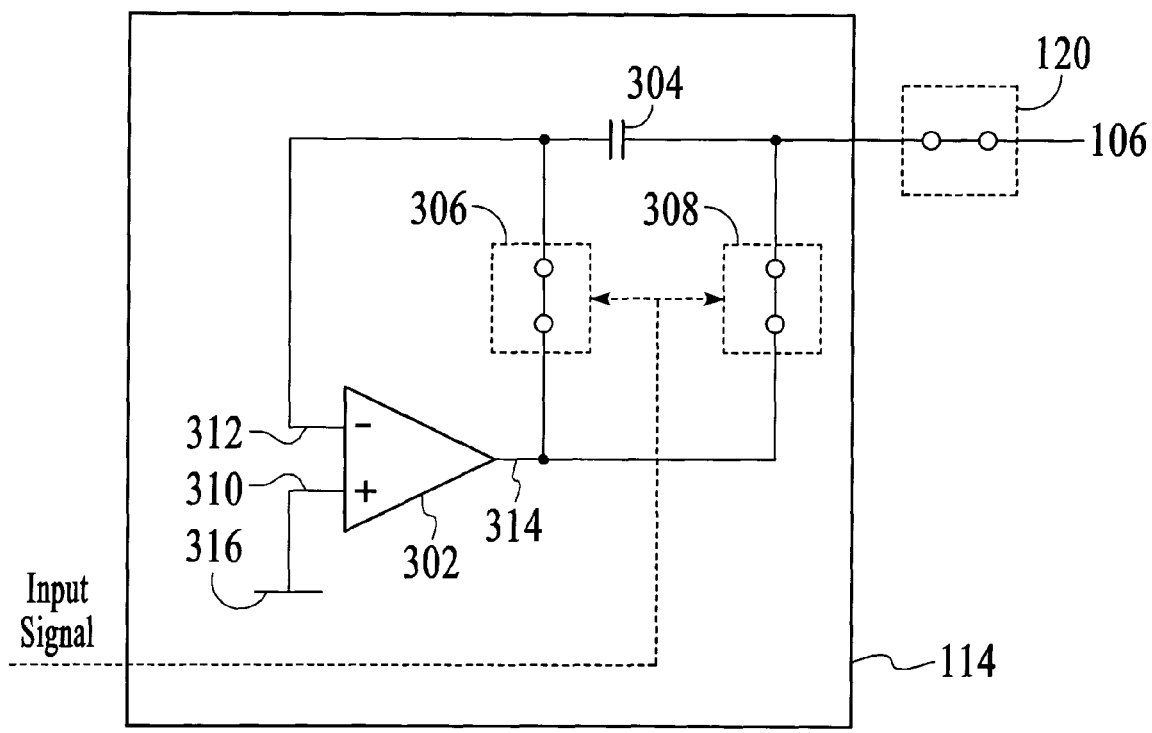
FIG. 3 is a diagram of a memory of the driver circuit of FIG. 1.

Turning now to FIG. 3, the memory 114 of the pull-up circuit 102 is shown. In FIG. 3, the memory 114 is shown with its switches in their respective states during a low-level section of a driving output signal, such as the low-level section 208 of the output signal 200 shown in FIG. 2. The memory 114 includes an amplifier 302, a memory capacitor 304, and switches 306 and 308. The amplifier 302 includes two inputs 310 and 312 and an output 314. The input 310 is connected to a constant voltage terminal 316, e.g., electrical ground, while the other input 312 is connected to one side of the memory capacitor 304. The output 314 of the amplifier 302 is connected to the switches 306 and 308, the other sides of which are connected to the opposite sides of the memory capacitor 304. As illustrated, the switches 306 and 308 are both controlled by the input signal. However, the switches 306 and 308 are operated such that only one of the switches is closed for a given state of the input signal. The node between the memory capacitor 304 and the switch 308 is connected via the switch 120 to the gate of the pull-up transistor 106 (not shown).

The operation of the memory 114 is now described. When the pull-up circuit 102 is inactive, the switch 306 is open and the switch 308 is closed. During this state, the switch 120 is also closed. Thus, the capacitor 304 is connected to the gate of the pull-up transistor 106, and applies the voltage from the rising edge transition of a previous operating cycle stored in the capacitor 304 to the gate of the pull-up transistor. When the state of the input signal changes, the switch 306 is closed and the switch 308 is opened, thereby connecting the amplifier 302 in a voltage follower configuration. In this configuration, one side of the capacitor 304 is forced to ground, while the other side receives the voltage on the gate of the pull-up transistor 106 resulting from the action of the feedback capacitor 112. Sometime after the gate of the pull-up transistor 106 has settled to a stable voltage, the switch 120 is opened, thereby storing the voltage on the gate of the pull-up transistor in the memory 114 in the memory capacitor 304. The opening of the switch 120 is caused by the voltage increase on the output node 124 due to the activation of the pull-up transistor 106 since the control input of the switch 120 is connected to the output node. When the pull-up circuit 102 returns to the inactive mode, the amplifier 302 is connected in the previously described configuration by the closing of the switch 308 and the opening of the switch 306. In addition, the switch 120 is closed again due to the voltage decrease on the output node 124. Thus, the previously stored voltage is applied to the gate of the pull-up transistor 106, whereby the pull-up transistor is biased at the appropriate level to produce a slew rate close to the desired slew rate at the next initial rising edge transition. Therefore, the memory 114 operates to provide an adaptive control of the voltage on the gate of the pull-up transistor 106 to ensure that the pull-up transistor conducts an appropriate current at the onset of each rising edge transition.

Figure 4:
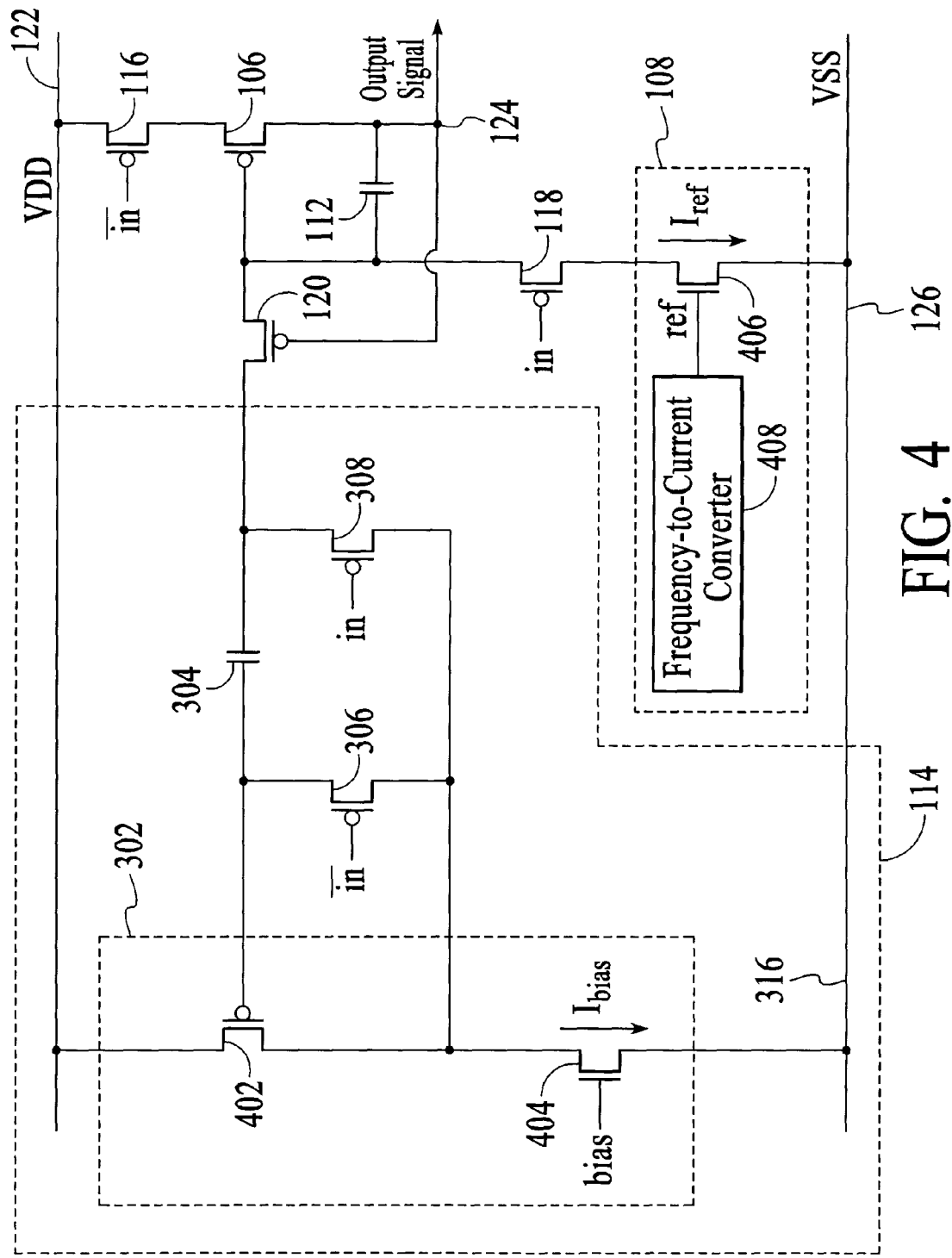
FIG. 4 is a transistor level diagram of the pull-up circuit of the driver circuit of FIG. 1 in accordance with an embodiment of the invention.

Turning now to FIG. 4, a transistor-level diagram of the pull-up circuit 102 in accordance with an embodiment of the invention is shown. In FIG. 4, the external input signal is identified as the in signal, and its logical complement is identified as the $\overline{\text{in}}$ signal. As shown in FIG. 4, the switches 116, 120, 306 and 308 are PFETs. The switch 118 is an N-channel field-effect transistor (NFET). The in signal is applied to the gates of the PFET 308 and the NFET 118, while the $\overline{\text{in}}$ signal is applied to the PFET 116 and 306. Thus, the transistors 118 and 308 are controlled by the in signal and the transistors 116 and 306 are controlled by the $\overline{\text{in}}$ signal.

In FIG. 4, the PFET 402 and the NFET 404 constitute the amplifier 302 of the memory 114. The bias signal applied to the NFET 404 controls the bias current of the amplifier 302. The bias current should be high enough to meet bandwidth requirements, but it is not otherwise related to the magnitude of the reference current $I_{ref}$. The NFET 406 and the frequency-to-current converter 408 represent the reference current source 108. The ref signal provided by the frequency-to-current converter 408 and applied to the NFET 406 determines the reference current $I_{ref}$. The supply voltage VDD on the high voltage terminal 122 and the ground VSS on the voltage terminals 126 and 316 determine the peak-to-peak amplitude of the trapezoidal output signal 200 generated by the driver circuit 100.

As stated above, the pull-down circuit 104 is configured in a mirror image of the pull-up circuit 102, except that complementary device types are used in the two circuits. Turning back to FIG. 1, the pull-down circuit 104 includes an output pull-down transistor 128, a reference current source 130, a feedback capacitor 134, an analog memory 136 and switches 138, 140 and 142. The pull-down transistor 128 and the switch 138 are connected in series with the output node 124 and a low voltage terminal 144, e.g., electrical ground. The drain of the pull-down transistor 128 is connected to the output node 124, while the source of the pull-down transistor is connected to the low voltage terminal 144 via the switch 138. The gate, i.e., the control terminal, of the pull-down transistor 128 is connected to the memory 136 via the switch 142. The pull-down transistor 128 is shown as an NFET. However, another type of transistor may instead be used.

The feedback capacitor 134 is connected between the output node 124 and the gate of the pull-down transistor 128. The gate of the pull-down transistor 128 is also connected to the reference current source 130 via the switch 140. Thus, the reference current source 130 is connected to the gate of the pull-down transistor 128 when the switch 140 is closed. The reference current source 130 is further connected to a high voltage terminal 146, which may be a supply voltage rail.

The control inputs of the switches 138 and 142 are connected to receive the input signal, which controls these switches. When the switches 138 and 140 are opened in response to one state of the input signal, the pull-down circuit 104 is deactivated and the voltage on the output node 124 is pulled high by the pull-up circuit 102. When the switches 138 and 140 are closed in response to the other state of the input signal, the pull-down circuit 104 is activated and the voltage on the output node 124 is pulled low by the pull-down circuit 104.

The control input of the switch 142 is connected to the output node 124. Thus, the switch 142 selectively connects the memory 136 to the gate of the pull-down transistor 128, depending on the voltage on the output node 124. Similar to the memory 114 of the pull-up circuit 102, the memory 136 is an analog memory that stores a voltage sample from the gate of the pull-down transistor 128 when the switch 142 is closed.

The operation of the pull-down circuit 104 is now described. When the switches 138 and 140 are open during the rising edge transitions 202 and the high level sections 206, the pull-down circuit 104 is inactive. During this period, the pull-up circuit 102 is activated to pull up the voltage on the output node 124. When the switches 138 and 140 are closed by the change in the state of the input signal at the start of the falling edge transition 204, the pull-down transistor 128 will conduct current, which tends to pull the voltage on the output node 124 low. The current conducted by the pull-down transistor 128 depends on the voltage on the gate of the transistor. Similar to the operation of the pull-up circuit 102, the initial gate voltage on the pull-down transistor 128 is provided by the memory 136. The initial gate voltage is the stored voltage from the previous operating cycle in which the pull-down transistor 128 was activated. The voltage decrease on the output node 124 causes current to flow through the capacitor 134. If the falling-edge slew rate of the voltage on the output node 124 is so high that feedback current through the capacitor 134 exceeds the reference current $I_{ref}$ provided by the current source 130, then the gate voltage of the pull-down transistor 128 will decrease. Consequently, the current flowing through the pull-down transistor 128 will decrease, which lowers the slew rate of the voltage on the output node 124.

Conversely, if the falling-edge slew rate of the voltage on the output node 124 is too low, then the reference current $I_{ref}$ will cause the gate voltage of the pull-down transistor 128 to increase. Consequently, the current flowing through the pull-down transistor 128 will increase, which increases the falling slew rate of the voltage on the output node 124. Similar to the pull-up circuit 102, the pull-down circuit 104 will stabilize at a point where the slew rate is constant and satisfies equation 1.

Below is a table that summarizes the states of the switches 116, 118, 120, 138, 140 and 142 at the beginning of each phase, e.g., the rising edge transition 202, the falling edge transition 204, the high-level section 206 or the low-level section 208, when either the pull-up circuit 102 or the pull-down circuit 104 is activated.

|  | rising edge transition 202 | high-level section 206 | falling edge transition 204 | low-level section 208 |
| --- | --- | --- | --- | --- |
| switch 116 | closed | closed | open | open |
| switch 118 | closed | closed | open | open |
| switch 120 | closed | open | open | closed |
| switch 138 | open | open | closed | closed |
| switch 140 | open | open | closed | closed |
| switch 142 | open | closed | closed | open |

Figure 5:
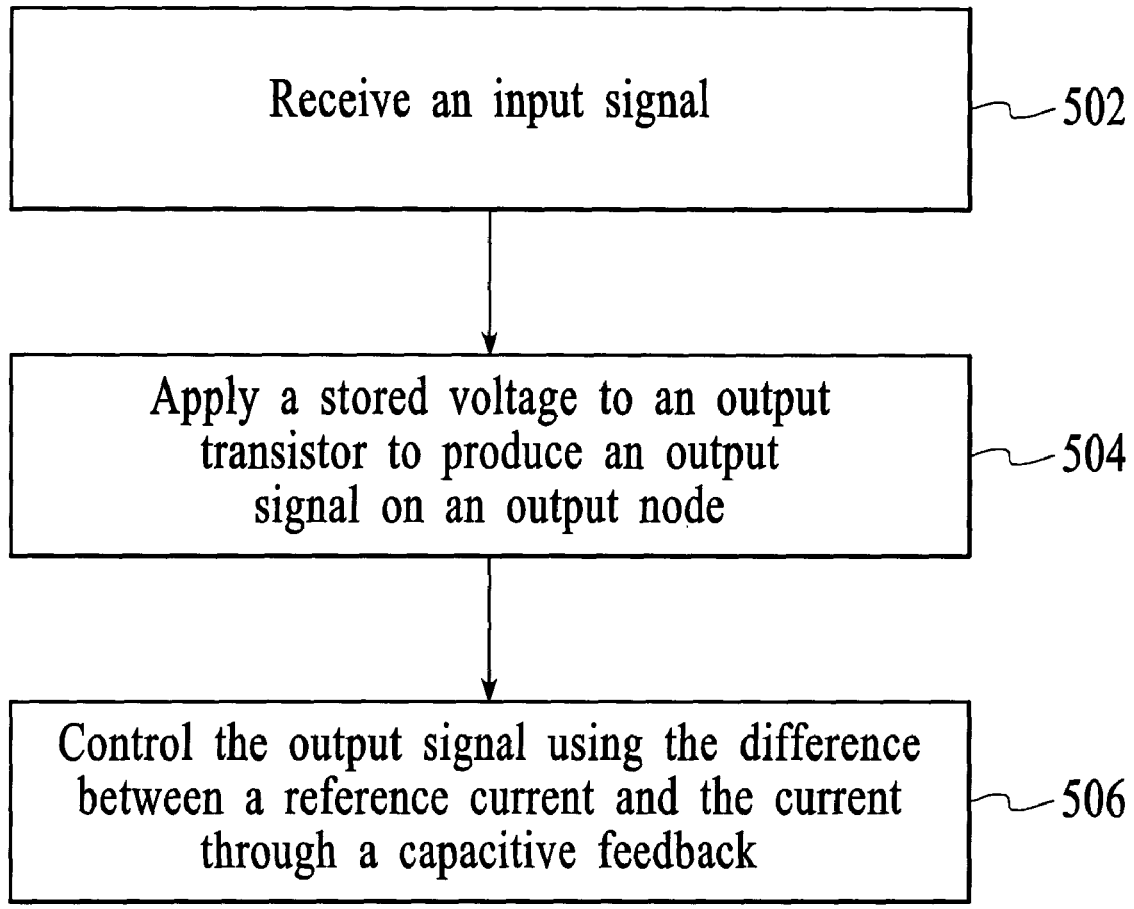
FIG. 5 is a flow diagram of a method for driving an electrical device, such as an LC device, in accordance with an embodiment of the invention.

A method for driving an electrical device, such as an LC device, is described with reference to the process flow diagram of FIG. 5. At block 502, an input signal is received. Next, at block 504, a stored signal is applied to an output transistor in response to the received input signal to produce an output signal on an output node. At block 506, the output signal on the output node is controlled using the difference between a reference current and the current through a capacitive feedback from the output node to the output transistor. This current difference can be used to control the rising-edge or falling-edge slew rate of the output signal on the output node.

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. A driver circuit comprising:
   an output transistor connected between a voltage terminal and an output node to produce an output signal on said output node, said output transistor including a control terminal;
   a current source connected to said control terminal of said output transistor to provide a reference current;
   a memory operatively connected to said control terminal of said output transistor, said memory being configured to store a signal on said control terminal of said output transistor from a previous operating cycle in which said output transistor was activated; and
   a feedback capacitor connected from said output node to said control terminal of said output transistor to control said output transistor as a function of a difference between current through said capacitor and said reference current.

2. The driver circuit of claim 1 wherein said memory includes a memory capacitor and an amplifier, said amplifier being connected to said memory capacitor and said output transistor such that said amplifier is selectively configured in a voltage follower configuration to store said signal on said control terminal of said output transistor in said memory capacitor.

3. The driver circuit of claim 2 further comprising a controlled switch located between said memory capacitor of said memory and said control terminal of said output transistor, said switch comprising a control input connected to said output node.

4. The driver circuit of claim 1 wherein said current source includes a frequency-to-current converter.

5. The driver circuit of claim 1 further comprising a first switch located between said voltage terminal and said output transistor and a second switch located between said current source and said control terminal of said output transistor, said first and second switches being controlled by an input signal.

6. The driver circuit of claim 1 further comprising:
   a second output transistor connected between said output node and a second voltage terminal, said second output transistor including a control terminal;
   a second current source connected to said control terminal of said second output transistor; and
   a second feedback capacitor connected from said output node to said control terminal of said second output transistor.

7. A driver circuit comprising:
   an output transistor connected between a voltage terminal and an output node to produce an output signal on the output node, said output transistor including a control terminal;
   a memory connected to said control terminal of said output transistor, said memory being configured to store a signal on said control terminal from a previous operating cycle in which said output transistor was activated;
   a current source connected to said control terminal of said output transistor to provide a reference current; and
   a feedback capacitor connected from said output node to said control terminal of said output transistor to control a rate of signal change on said output node.

8. The driver circuit of claim 7 wherein said memory includes a memory capacitor and an amplifier, said amplifier being connected to said memory capacitor and said output transistor such that said amplifier is selectively configured in a voltage follower configuration to store said signal on said control terminal of said output transistor in said memory capacitor.

9. The driver circuit of claim 8 further comprising a controlled switch located between said memory capacitor of said memory and said control terminal of said output transistor, said switch comprising a control input connected to said output node.

10. The driver circuit of claim 7 wherein said current source is configured to generate said reference current proportional to a reference voltage and a reference frequency.

11. The driver circuit of claim 10 wherein said current source includes a frequency-to-current converter.

12. The driver circuit of claim 10 further comprising a first switch located between said voltage terminal and said output transistor and a second switch located between said current source and said control terminal of said output transistor, said first and second switches being controlled by an input signal.

13. The driver circuit of claim 7 further comprising:
a second output transistor connected between said output node and a second voltage terminal, said second output transistor including a control terminal;
a second memory connected to said control terminal of said second output transistor, said second memory being configured to store a signal on said control terminal of said second output transistor from a previous operating cycle when said second output transistor was activated;
a second current source connected to said control terminal of said second output transistor to provide a second reference current; and
a second feedback capacitor connected from said output node to said control terminal of said second output transistor to control a second rate of signal change on said output node.

14. A method for driving an electrical device, said method comprising:
storing a signal on a control terminal of an output transistor from a previous operating cycle in which the output transistor was activated in a memory as a stored signal, said memory being operatively connected to said control terminal of said output transistor;
receiving an input signal;
applying said stored signal to said output transistor in response to said input signal to produce an output signal on an output node connected to said output transistor; and
controlling said output signal on said output node using a difference between a reference current and current capacitively fed back from said output node.

15. The method of claim 14 further comprising storing a control signal on said output transistor as said stored signal.

16. The method of claim 14 wherein said controlling includes generating said reference current using a reference frequency and a reference voltage, and applying said reference current to a control terminal of said output transistor.

17. The method of claim 14 further comprising:
applying a second stored signal to a second output transistor in response to said input signal to change said output signal on said output node; and
controlling said output signal on said output node using a difference between a second reference current and a second current capacitively fed back from said output node to said second output transistor.

18. The method of claim 17 further comprising alternately activating said output transistor and said second output transistor.

19. The driver circuit of claim 1 wherein said current source is configured to generate said reference current proportional to a reference voltage and a reference frequency.

* * * * *